United States Patent [19]

Wanlass et al.

[11] Patent Number: 4,963,949
[45] Date of Patent: Oct. 16, 1990

[54] SUBSTRATE STRUCTURES FOR INP-BASED DEVICES

[75] Inventors: Mark W. Wanlass, Golden; Peter Sheldon, Lakewood, both of Colo.

[73] Assignee: The United States of America as represented of the United States Department of Energy, Washington, D.C.

[21] Appl. No.: 251,484

[22] Filed: Sep. 30, 1988

[51] Int. Cl.[5] .................... H01L 29/205; H01L 31/06
[52] U.S. Cl. .......................................... 357/16; 357/30; 357/4; 357/61; 437/132
[58] Field of Search .................... 357/16, 30, 4, 61; 437/132

[56] References Cited

U.S. PATENT DOCUMENTS 4,591,654  5/1986  Yamaguchi et al. .................. 357/16

FOREIGN PATENT DOCUMENTS 61-189621  8/1986  Japan .................................. 437/132

OTHER PUBLICATIONS

Uchida et al., Tech. Dig. Int. PVSEC-3, Tokyo, Jap., 1987, "Heteroepitary . . . Cells".
Chen et al., Vacuum Tech. Research & Develop., pp. 61–66, 1988, "Combine . . . GaAs".
Razeghi et al., Appl. Phys. Lett., 52 (3), Jan. 18, 1988, pp. 209–211.
"High–Quality GaInAsP/ImP 200 Substrates".
IEEE Photovoltaics Specialists Conf., New Orleans, 1987, pp. 267–272, "High Efficiency . . . Si Substrates", Yamaguchi et al.
Yamaguchi et al., Solar Cells, "A New Approach . . . InP Solar Cells", 19, (1986–1987), pp. 85–96.
Seki et al., Jap. Jour. Appl. Phys., vol. 26, No. 10, Oct. 87, pp. L1587–L1589, "MOCVD Growth of InP . . . Layer".

Primary Examiner—Jerome Jackson, Jr.
Attorney, Agent, or Firm—Kenneth Richardson; John M. Albrecht; William R. Moser

[57] ABSTRACT

A substrate structure for an InP-based semiconductor device having an InP based film is disclosed. The substrate structure includes a substrate region having a lightweight bulk substrate and an upper GaAs layer. An interconnecting region is disposed between the substrate region and the InP-based device. The interconnecting region includes a compositionally graded intermediate layer substantially lattice-matched at one end to the GaAs layer and substantially lattice-matched at the opposite end to the InP-based film. The interconnecting region further includes a dislocation mechanism disposed between the GaAs layer and the InP-based film in cooperation with the graded intermediate layer, the buffer mechanism blocking and inhibiting propagation of threading dislocations between the substrate region, and the InP-based device.

15 Claims, 1 Drawing Sheet

SUBSTRATE STRUCTURES FOR INP-BASED DEVICES

CONTRACTUAL ORIGIN OF THE INVENTION

The U.S. Government has rights in this invention under Contract No. DE-AC02-83CH10093 between the U.S. Department of Energy and the Solar Energy Research Institute, a Division of the Midwest Research Institute.

BACKGROUND OF THE INVENTION

1. Field of the Invention

The present invention relates, generally, to semiconductor devices and, more particularly, to InP-based devices. Specifically, the present invention relates to improved substrate structures for InP-based devices which are mechanically rugged, inexpensive lightweight.

2. Description of the Prior Art

Semiconductor devices have wide versatility and applications. Use of semiconductors for photovoltaic, integrated circuit, and optoelectronic applications has grown immensely in recent years, and adaptations of such devices to space environments have received considerable attention. One common problem with conventional semiconductors is their lack of radiation resistance required to insure degradation-free operation in space. This problem is especially troublesome when considering space photovoltaics where conventional Si solar cells degrade with time. Thus, alternate semiconductor materials have been investigated to overcome these and other nonsolar application problems.

Indium phosphide (InP) is an attractive III-V semiconductor for a variety of electronic device applications because of the large number of lattice-matched III-V ternary and quaternary materials available, for example GaAsSb, GaInAs, AlAsSb, and AlInAs. In addition to being lattice matched, these compounds offer a wide range of band gaps, which aid in the design of complex device structures. InP is also considered a prime candidate for space photovoltaic applications because of its superior radiation hardness and demonstrated high efficiencies. Additional applications include monolithic integration of InP based optoelectronic devices with Si- or GaAs-based devices. However, the primary impediments to such applications have been high cost, low availability, and inherent fragility of the InP substrates. Consequently, research efforts have been under way to investigate possible InP arrangements that can overcome some of the above deficiencies.

U.S. Pat. No. 4,591,654 discloses an InP solar cell having a Si substrate with a GaInP layer disposed between the Si and the InP layers. The GaInP layer is a graded layer having a higher concentration of Ga on the Si side and a higher concentration of In on the InP side. Unfortunately, this arrangement is limited to the use of Si, does not take into account the potential problems associated with thermal expansion coefficient differences between Si and InP, and does not deal effectively with the dislocation propagation problem from the Si substrate into the InP layer.

Various technical articles disclose other attempts to solve the problem of growing InP on a foreign substrate. InP layers have been deposited directly onto Si and GaAs. However, the InP layers thus formed contain high dislocation densities resulting from the large lattice mismatch. These dislocations severely degrade device performance. For example, although some InP/Si solar cells have been formed using the above techniques, they generally have had poor performance characteristics. Thus, there is still a need for a structure which allows device quality InP to be grown on alternate substrates in a manner to effectively reduce the dislocation generation propagation problem stemming from lattice mismatch.

SUMMARY OF THE INVENTION

Accordingly, it is one object of the present invention to provide a low cost InP-based semiconductor device.

Another object of the present invention is to provide a low-cost, light weight substrate structure for an InP-based semiconductor device.

A further object of the present invention is to provide a method for growing device-quality InP on a foreign substrate while minimizing the propagation of dislocations into the InP layer.

To achieve the foregoing and other objectives and in accordance with the purpose of the present invention, as embodied and broadly described herein, a substrate structure for an InP-based semiconductor device having an InP based film is disclosed. The substrate structure includes a substrate region, which is composed of a lightweight bulk substrate and an upper GaAs layer. An interconnecting region is disposed between the substrate region and the InP-based device. The interconnecting region includes a compositionally graded intermediate layer substantially lattice-matched at its one end to said GaAs layer and substantially lattice-matched at its opposite end to said InP-based film. The interconnecting region further includes a dislocation buffer mechanism disposed between the GaAs layer and the InP-based film in cooperation with the graded intermediate layer, the buffer layer blocking and inhibiting propagation of threading dislocations between the substrate and the InP-based device.

BRIEF DESCRIPTION OF THE DRAWINGS

The accompanying drawing, which is incorporated in and forms a part of the specification, illustrates preferred embodiments of the present invention. Together with the description, the drawing serves to explain the principles of the invention. In the drawing.

DETAILED DESCRIPTION OF THE PREFERRED EMBODIMENTS

Figure 1:
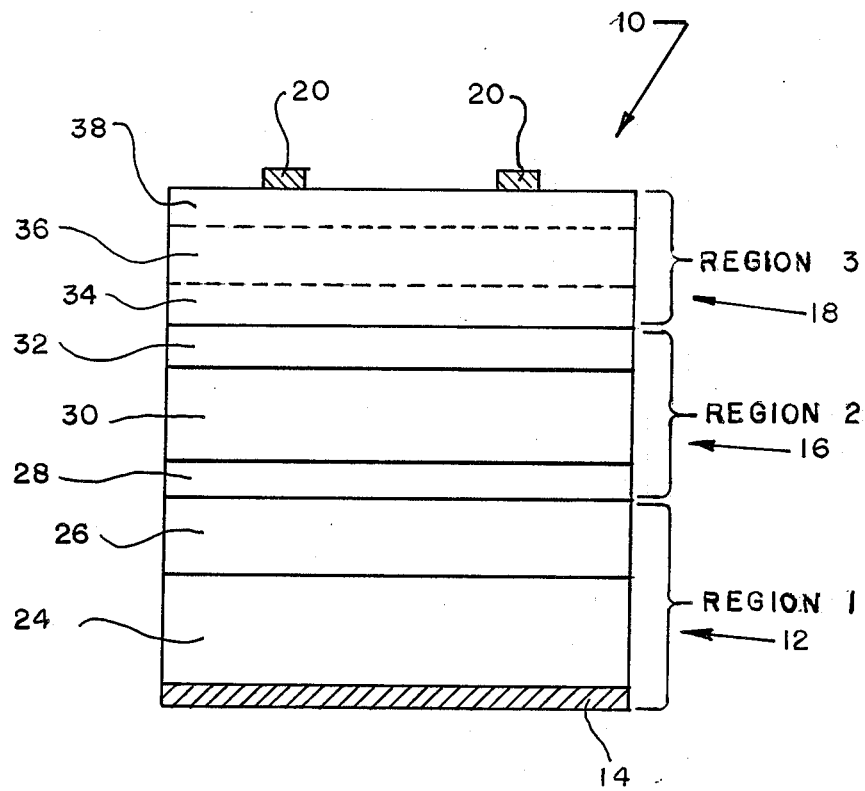
FIG. 1 is a schematic illustration of one embodiment of a specific semiconductor cell arrangement constructed in accordance with the present invention.

As indicated above, InP is an attractive III-V semiconductor for a variety of electronic device applications because of its electronic and optoelectronic properties. However, a main impediment to such applications is the high cost, fragility, and high mass density of InP substrates. Si substrates have many advantages over InP substrates, because in addition to its low cost and low/density, Si has mechanical and thermal conductive properties superior to InP. Therefore, an important advance in InP device technology is realized if device-quality layers of InP can be produced on alternative low-cost, lightweight substrates such as Si. Although Si has many advantages, several problems exist for an integrated InP/Si structure. These include high defect densities generated from the 8% lattice mismatch between InP and Si, epilayer cracking problems associated with differences in thermal expansion coefficients, and substrate impurity diffusion effects. The present invention details a unique structure on which InP-based devices can be fabricated using Si, GaAs, Ge, and other low-cost substrates, and the method of formation thereof, which reduce or even eliminate the above-mentioned problems.

The present invention involves the design and fabrication of a special monolithic interconnecting structure or layer between an InP-based layer and the selected substrate. Referring now to FIG. 1, a semiconductor cell or device 10 is illustrated as comprised of three distinct parts labeled as regions 1, 2 and 3. Region 1 is the substrate structure 12 to which may be attached a back contact element 14. Region 2 comprises an interconnecting structure 16 which includes an intermediate graded layer as described in more detail below. Region 3 is the InP film 18 in which a device would be constructed as detailed below and to which may be attached a contact element 20.

In more detail, substrate structure 12 may be constructed from any number of appropriate substances and combinations as described below and preferably includes two portions. The lowermost substrate portion or layer 24 is the base or bulk substrate structure, which is covered by a GaAs layer 26. The substrate layer 24 may be selected from any appropriate low-cost, lightweight material and is most preferably selected from one of the group of Si, Ge, GaAs, and combinations thereof, particularly Ge/Si, GaAs/Si, and GaAs/Ge/Si, depending upon the InP device application. While Si is the least expensive option for the layer 24, GaAs is the simplest option because high quality GaAs substrates are readily available, it has only a 4% lattice mismatch with InP, and the technology for epitaxial deposition of III–V compounds on GaAs is relatively well developed. Furthermore, GaAs has a relatively low thermal expansion coefficient differential and is useful for optoelectronic integration with InP. Regardless of the particular substrate selected as the layer 24, the layer 24 is preferably always covered with the GaAs layer 26. GaAs is preferably selected because it is a highly desirable starting point for the Region 2 described below.

Ge is also a preferred substrate material for the layer 24, either alone or in combination with Si and/or GaAs. Ge is low in cost and therefore would give a further reduction in overall cost. High-quality GaAs films can be readily grown on Ge because it is lattice matched to Ge, resulting in a substrate structure equivalent to a bulk GaAs substrate. Ge is also structurally rugged, is useful for photovoltaic tandem devices, and has a relatively low thermal expansion coefficient difference with InP to reduce cracking.

A Si substrate alone or in combination as GaAs/Si or GaAs/Ge/Si may also be utilized as the layer 24. This structure utilizes a Si wafer as a basis of the structure, with the Ge and GaAs layers being epitaxially deposited on the Si substrate in one form. The Ge layer between the Si and GaAs in this embodiment is included to enhance the epitaxy of the GaAs. Because of a 4% lattice mismatch between GaAs and Si, a first buffer layer 28 in the region 2 or structure 16 is provided as described in more detail below. A primary advantage of this embodiment is that Si serves as the bulk substrate, while all the remaining materials are used in thin film form or in combinations as disclosed above, thus maintaining the advantages of using Si as the base substrate. Use of Si in this manner provides a low-cost, lightweight, rugged substrate that is also useful for photovoltaic tandem devices. The first buffer layer 28 is still required as described below.

The interconnecting structure 16 preferably includes a compositionally graded layer 30 which is sandwiched between a first buffer layer 28 and a second buffer layer 32. The first buffer layer 28 is preferably selected from any one of several dislocation blocking layers as are well known in the art. Examples of such layers include a strained layer superlattice, a thermally annealed layer, a heavily doped layer, thermally cycled or interrupted growth layers, and an isoelectronically doped layer, all of which reduce dislocation densities. Specific examples of superlattice structures are found in *Journal of Vac. Sci. Tech.*, B3, by W. I. Wang, 552 (1985), and *J. Appl. Phys.* 57, by T. Soga et al., 4578 (1985). The contents of which are specifically incorporated herein by reference. A preferred superlattice structure is composed of GaInAs/GaAs. Specific examples of some of the other above-referenced layers are illustrated in the Journal of Crystal Growth, 78 (1986), pgs. 249–256; in *Applied Phys. Letters* 47(8), Oct. 1985, pg. 828; and in *J. Appl. Phys.*, 63(11), Jun. 1988, pgs. 5609–5611. The contents of which are all specifically incorporated herein by reference. Such structures also help to eliminate substrate impurity diffusion and epilayer cracking problems by reducing the effects of lattice mismatch. This first buffer layer 28 reduces defect density blocking dislocation propagation from the GaAs layer and the substrate 24. In the embodiments wherein Ge or GaAs are selected for use in the substrate layer 24, the first buffer layer 28 may be selected from the same material used in the graded layer 30 and merged therewith, thereby effectively eliminating the first layer 28 in these particular embodiments.

The compositionally graded layer 30 is preferably a substance which is substantially lattice-matched at its bottom end to the GaAs layer 26 and is likewise substantially lattice-matched at its opposite or upper end to the InP-based layer 18. The compositional grading can be accomplished by gradually adding or deleting a component to the base substance from its bottom to its top, thus allowing a smooth transition between the two ends as mentioned above. In either event, the lattice constant of the graded layer 30 is different at each of its two ends, thus allowing a substantial lattice match at its two ends with two different substances, i.e. layer 26 and layer 18. In addition, a second buffer layer 32 is disposed on the top of the graded layer 30 to block the propagation of defects and dislocations from the intermediate graded layer 30, although kept at a minimum, into the top InP layer structure 18.

The intermediate graded layer 30 is preferably constructed from one of several preferred options. One preferred option for the layer 30 is GaInP. More specifically, $Ga_{0.52}In_{0.48}P$ comprises the bottom portion of the layer 30 since it is lattice-matched to GaAs, and then the Ga is graded out of the GaInP to arrive at InP at the upper portion of the layer 30. A second preferred option is to start with GaAs and then grading in the proper proportion of In. In this manner, one arrives at a GaInAs composition, such as $Ga_{0.47}In_{0.53}As$ which is lattice-matched to InP. Still another preferred embodiment for the layer 30 includes beginning with GaAs and then grading in Sb until a composition of GaAsSb is obtained which is substantially lattice-matched to InP.

The second buffer layer 32 may comprise any desired substance which will perform the function of the layer 32. One preferred embodiment for the layer 32 is to use a strained-layer superlattice (SLS). In this option, a narrow SLS may be selected from any one of several compositions including $Ga_xIn_{1-x}As/Ga_yIn_{1-y}As$ or $GaAs_xSb_{1-x}/GaAs_ySb_{1-y}$, where the average composition of the superlattice is nominally lattice-matched to the InP layer. All of these compositions can be used to reduce the propagation of threading dislocations generated in the graded layer 30 from entering the InP layer structure 18. Another preferred option for the second buffer layer 32 includes a high impurity-doped InP buffer layer. The InP may be doped heavily with sulfur, zinc, or any other appropriate dopant. Doping in this manner has been shown to inhibit the propagation of threading dislocations. Still another preferred embodiment for the second buffer layer 32 includes using an isoelectronically-doped InP compound. InP layers doped with an isoelectronic atom, such as Ga, have also successfully inhibited dislocation propagation. Other examples of compounds useful in reducing or eliminating dislocation propagation into the layer 32 include those disclosed in the references previously incorporated herein as pertaining to the first buffer layer 28.

The region 3 or structure 18 may be selected from any well known InP devices or any combination of appropriate InP layers. For example, InP layers having different dopants and concentrations of dopants may be used. Examples of such InP-based devices are disclosed in the *Japanese Journal of App. Phys.*, 26(3), Mar. 1987, pgs, L176-L178; in *Electronics Letters* 21(12), Jun. 1985, pg. 621; in *Journal of Crystal Growth* 48, 1980, pgs. 403-410; in *Electronic Letter*, 24(5), Mar. 1988; and in *J. Vac. Sci. Technol.*, A6(3), May/Jun. 1988, pg. 1722. The contents of which are specifically incorporated herein by reference. As one example, a p+ layer 34 may be formed by using InP doped with zinc while a p layer 36 may be formed by using a lower concentration of zinc. The n layer 38 may then be formed by using InP doped with a sulfur or selenium, thereby forming a p/n junction. Other examples of InP devices that may be used as the InP structure 18 include shallow homojunction photovoltaic cells, ITO/InP photovoltaic cells, semiconductor lasers, FETs, heterojunctions, or monolithic, multijunction cascade/devices.

As can be seen from the above, the present invention provides a unique structure upon which to fabricate an InP-based semiconductor device, and also provides a novel method of manufacture, which eliminates the use of high cost InP substrates by using low-cost alternative substrate structures. The device of the invention uses various intermediate layers to reduce the deleterious effects normally associated with depositing InP on foreign substrates. Specifically, the present invention reduces high defect densities, epilayer cracking and substrate impurity diffusion. Consequently, a highly efficient InP-based semiconductor device is provided at low-cost and by using easily obtainable materials.

While the foregoing description and illustration of the present invention has been particularly shown in detail with reference to preferred embodiments and modifications thereof, it should be understood by those skilled in the art that the foregoing and other modifications are exemplary only, and that equivalent changes in composition and detail may be employed therein without departing from the spirit and scope of the invention as claimed except as precluded by the prior art.

The embodiments in which an exclusive property or privilege is claimed are defined as follows:

1. A substrate structure for an InP based semiconductor device having an InP based film comprising:
   substrate means including a light-weight bulk substrate and an upper GaAs layer; and
   an interconnecting region disposed between said substrate means and said InP based device, said interconnecting region including a compositionally graded intermediate layer substantially lattice matched at its one end to said GaAs layer and substantially lattice matched at its opposite end to said InP based film, said interconnecting region further including buffer means disposed between said GaAs layer and said InP based film in cooperation with said graded intermediate layer, said buffer means blocking and inhibiting propagation of threading dislocations between said substrate means and said InP based device.

2. The substrate structure as claimed in claim 1, wherein said lightweight bulk substrate is selected from the group consisting of Si, Ge, GaAs, and combinations thereof.

3. The substrate structure as claimed in claim 2, wherein said lightweight bulk substrate comprises Si.

4. The substrate structure as claimed in claim 1, wherein said compositionally graded intermediate layer comprises a substance substantially lattice matched to GaAs with a graded differential in a component thereof across its thickness to terminate as a substance substantially lattice matched to InP.

5. The substrate structure as claimed in claim 4, wherein said graded intermediate layer is selected from the group consisting of GaInP having Ga graded out to InP, GaAs having In graded in to a GaInAs composition, and GaAs having Sb graded in to GaAsSb.

6. The substrate structure as claimed in claim 1, wherein said buffer means includes a first buffer means comprising a layer disposed between said GaAs layer and said graded intermediate layer effective in blocking dislocations originating in said GaAs layer.

7. The substrate structure as claimed in claim 6, wherein said first dislocation-blocking buffer layer is selected from the group consisting of a strained-layer superlattice, a thermally annealed layer, a heavily doped layer, a thermally cycled growth layer, an isoelectronically doped layer and combination thereof.

8. The substrate structure as claimed in claim 7, wherein said first dislocation blocking buffer layer comprises a GaInAs/GaAs strained-layer superlattice.

9. The substrate structure as claimed in claim 1, wherein said buffer means includes a layer disposed between said graded intermediate layer and said InP based film effective in blocking dislocations originating in said graded intermediate layer.

10. The substrate structure as claimed in claim 9, wherein said dislocation-blocking buffer layer is selected from the group consisting of a strained layer superlattice, a high impurity-doped InP layer, an isoelectronically-doped InP layer, a thermally cycled growth layer and combinations thereof.

11. In an InP-based semiconductor device having an InP p/n junction layer supported by a base substrate support structure, the improvement comprising an interconnecting region disposed between said InP layer and said substrate support structure, said interconnecting region including a compositionally graded intermediate layer that is substantially lattice-matched at its upper end to said InP layer and is further substantially lattice-matched at its lower end to said substrate support structure, said interconnecting region further including first and second buffer means disposed between said intermediate layer and, respectively, said substrate support structure and said InP layer to inhibit the propagation of dislocations, and wherein said improvement further comprises a GaAs layer incorporated as part of said substrate support structure in the upper portion thereof adjacent said first buffer means.

12. The improvement as claimed in claim 11, wherein said first buffer means is selected from the group consisting of a strained-layer superlattice, a thermally annealed layer, a heavily doped layer, an isoelectronically doped layer, a thermally cycled growth layer and combinations thereof, all of which are effective in blocking propagation of dislocations originating in said GaAs layer.

13. The improvement as claimed in claim 11, wherein said graded intermediate layer comprises a composition having a single component graded thereacross to provide said lattice matching at both said upper and lower ends.

14. The improvement as claimed in claim 13, wherein said graded intermediate layer is selected from the group consisting of GaInP having Ga graded out to InP, GaAs having In graded in to a GaInAs composition, and GaAs having Sb graded in to GaAsSb.

15. The improvement as claimed in claim 11, wherein said second buffer means is selected from the group consisting of a strained-layer superlattice selected from the group consisting of GaInP/InP, GaInAs/InP, and GaAsSb/InP, a high impurity-doped InP layer having a dopant selected from the group consisting of sulfur and zinc, and an isoelectronically-doped InP layer.

* * * * *